(12) United States Patent
Hsu

(10) Patent No.: US 7,339,813 B2
(45) Date of Patent: Mar. 4, 2008

(54) COMPLEMENTARY OUTPUT RESISTIVE MEMORY CELL

(75) Inventor: Sheng Teng Hsu, Camas, WA (US)

(73) Assignee: Sharp Laboratories of America, inc., Camas, WA (US)

( * ) Notice: Subject to any disclaimer, the term of this patent is extended or adjusted under 35 U.S.C. 154(b) by 256 days.

(21) Appl. No.: 10/957,298

(22) Filed: Sep. 30, 2004

(65) Prior Publication Data

US 2006/0067104 A1    Mar. 30, 2006

(51) Int. Cl.
*G11C 11/00* (2006.01)
*G11C 11/15* (2006.01)

(52) U.S. Cl. .................. 365/148; 365/158; 365/171; 365/173

(58) Field of Classification Search ............... 365/148, 365/158, 171, 173
See application file for complete search history.

(56) References Cited

U.S. PATENT DOCUMENTS

| | | | |
|---|---|---|---|
| 6,204,139 B1 | 3/2001 | Liu | |
| 6,473,332 B1* | 10/2002 | Ignatiev et al. | 365/148 |
| 6,496,051 B1 | 12/2002 | Hsu | |
| 6,512,690 B1* | 1/2003 | Qi et al. | 365/171 |
| 6,531,325 B1 | 3/2003 | Hsu | |
| 6,531,371 B2 | 3/2003 | Hsu | |
| 6,538,917 B1* | 3/2003 | Tran et al. | 365/158 |
| 6,549,455 B2* | 4/2003 | Yamada | 365/158 |
| 6,569,745 B2 | 5/2003 | Hsu | |
| 6,583,003 B1 | 6/2003 | Hsu | |
| 6,590,268 B2* | 7/2003 | Adachi et al. | 365/171 |
| 6,664,117 B2 | 12/2003 | Zhuang | |
| 6,673,691 B2 | 1/2004 | Zhuang | |
| 6,693,821 B2 | 2/2004 | Hsu | |
| 6,746,910 B2 | 6/2004 | Hsu | |
| 6,759,249 B2 | 7/2004 | Zhuang | |
| 6,774,004 B1 | 8/2004 | Hsu | |
| 6,774,054 B1 | 8/2004 | Zhang | |
| 6,801,448 B2 | 10/2004 | Hsu | |
| 6,839,274 B2* | 1/2005 | Jang et al. | 365/173 |
| 6,888,743 B2* | 5/2005 | Durlam et al. | 365/171 |
| 6,888,745 B2* | 5/2005 | Ehiro et al. | 365/158 |
| 6,888,773 B2* | 5/2005 | Morimoto | 365/148 |
| 6,912,146 B2* | 6/2005 | Gill et al. | 365/148 |
| 7,016,222 B2* | 3/2006 | Morikawa | 365/158 |
| 2003/0142578 A1 | 7/2003 | Hsu | |
| 2003/0206481 A1 | 11/2003 | Hsu | |
| 2004/0061180 A1 | 4/2004 | Hsu | |
| 2004/0170048 A1 | 9/2004 | Hsu | |

* cited by examiner

*Primary Examiner*—Trong Phan
(74) *Attorney, Agent, or Firm*—Law Offices of Gerald Maliszewski; Gerald Maliszewski

(57) ABSTRACT

A complementary resistive memory structure is provided comprising a common source electrode and a first electrode separated from the common source electrode by resistive memory material; and a second electrode adjacent to the first electrode and separated from the common source electrode by resistive memory material, along with accompanying circuitry and methods of programming and reading the complementary resistive memory structure.

8 Claims, 4 Drawing Sheets

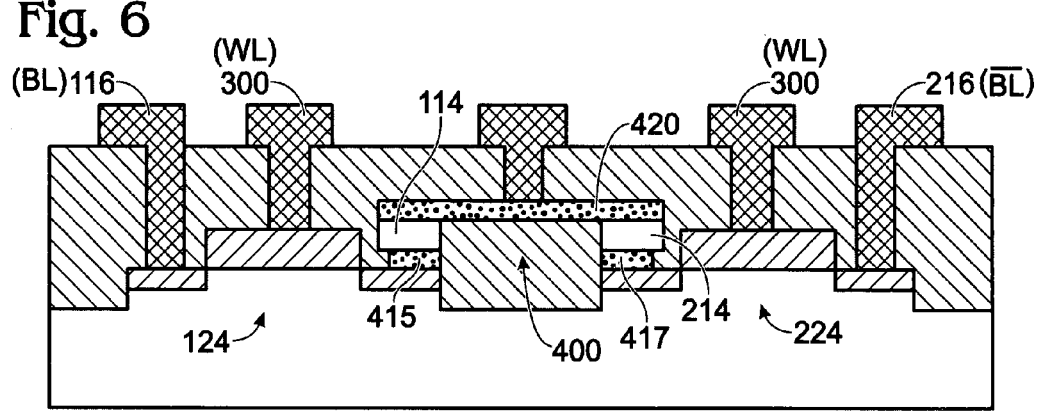
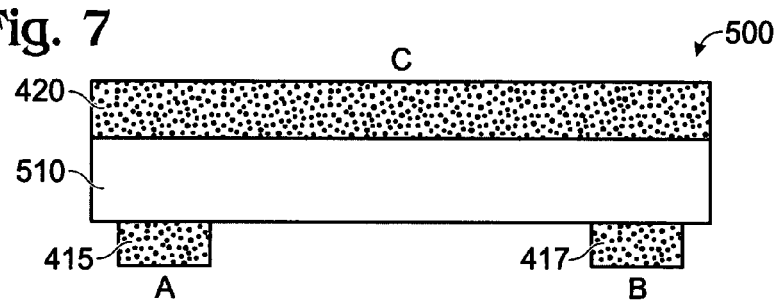
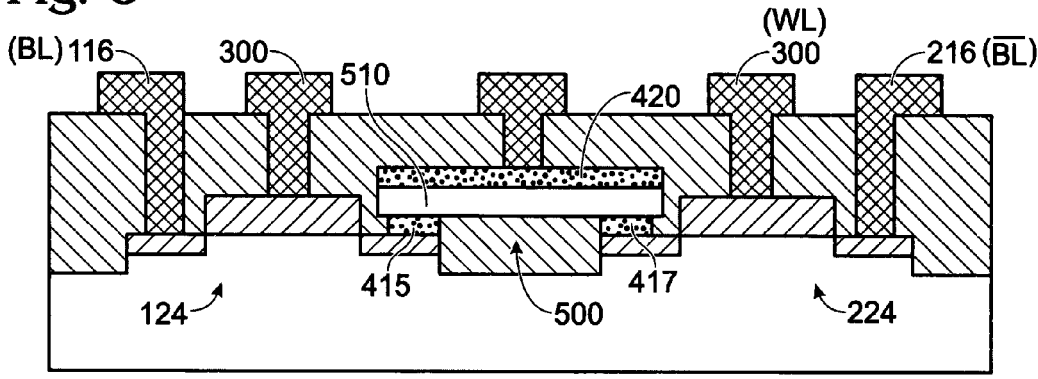

COMPLEMENTARY OUTPUT RESISTIVE MEMORY CELL

BACKGROUND OF THE INVENTION

The present device structures relate generally to resistive memory devices and more specifically to a complementary output memory cell.

A complementary memory cell has two bits capable of being programmed and of outputting a complementary output such that when the first bit is 0; the second bit is 1, and when first bit is 1; the second bit is 0. Complementary memory cells often require a large cell size and the programming process may be complicated and slow.

BRIEF DESCRIPTION OF THE DRAWINGS

FIG. 6 is a cross-sectional view of a resistive memory structure for use in a complementary resistive memory cell shown in FIG. 5.

FIG. 7 is a cross-sectional view of a resistive memory structure for implementing another embodiment of the complementary resistive memory cell.

FIG. 8 is a cross-sectional view of a resistive memory structure for implementing the complementary resistive memory cell utilizing the resistive memory structure of FIG. 7.

DETAILED DESCRIPTION OF THE INVENTION

Certain embedded memory applications require a complementary digital output, that is a 0 for bit A and a 1 for bit B, or vice versa. Accordingly, a complementary, resistive memory device is provided.

Figure 1:
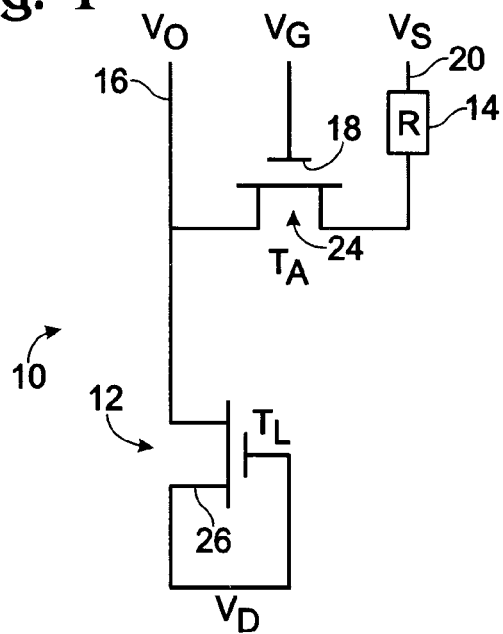
FIG. 1 is a schematic view of a unit resistive memory cell.

FIG. 1 is a schematic view of a unit, resistive memory cell 10 with a gated diode load ($V_D$) provided by the load transistor ($T_L$) 12. A memory resistor (R) 14 is written to a high-resistance state by applying ground to an output ($V_O$) 16, applying a programming voltage ($V_P$), also referred to herein as gate voltage ($V_G$), to a gate 18 of an active transistor ($T_A$) 24, and applying a programming pulse voltage to the memory resistor (R) at a voltage source ($V_S$) 20 and floating the drain 26 of the load transistor The programming voltage ($V_P$) is larger than the amplitude of the minimum programming pulse voltage by at least 1 V.

The memory resistor (R) 14 is written to a low-resistance state by setting the source voltage ($V_S$) to ground at the voltage source 20, setting the gate voltage ($V_G$) to a programming voltage ($V_P$) at the gate 18, and applying a programming pulse voltage to a drain 26. Again, the programming voltage ($V_P$) is larger than the amplitude of the minimum programming pulse voltage by at least 1V. Again the drain voltage of the load transistor, $V_D$ is not biased.

The memory resistor (R) 14 may be read by setting the voltage source ($V_S$) to ground at the source 20, setting the gate voltage ($V_G$) at the gate 18 and the drain voltage ($V_D$) at the drain 26 to a read voltage ($V_A$), and monitoring the output voltage ($V_O$) at the output 16. When the memory resistor (R) 14 is at the high-resistance state the current is very small, and the output voltage ($V_O$) at the output 16 is nearly equal to the drain voltage ($V_D$) at the drain 26. When the memory resistor (R) 14 is at the low-resistance state the output voltage ($V_O$) at the output 16 is nearly equal to the source voltage ($V_S$) at the source 20, which is being held at ground. This property is illustrated by the following equations:

$$I_D = \frac{W}{2L}\mu C_O(V_G - V_T - IR) = \frac{E}{2L}\mu C_O(V_D - V_T - V_O)^2$$

In these calculations, it is assumed that the active transistor ($T_A$) and the load transistor ($T_L$) are identical. The geometry of these two transistors can be adjusted to improve memory device performance.

Figure 2:
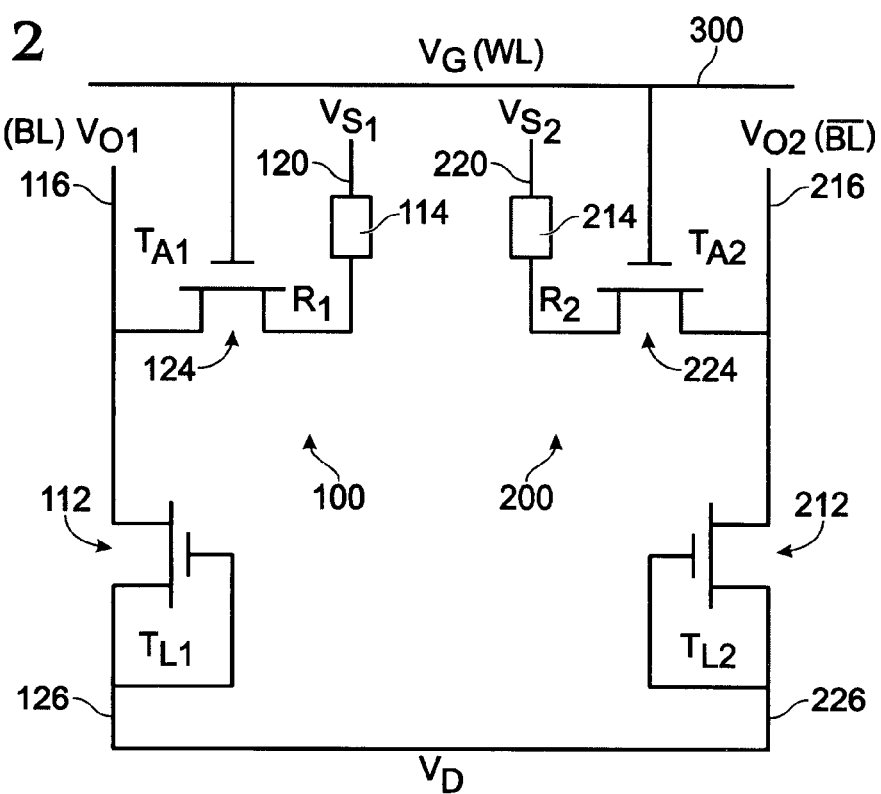
FIG. 2 is a schematic view of a complementary resistive memory cell employing two unit resistive memory cells as provided in FIG. 1.

FIG. 2 is a schematic view of a complementary resistive memory cell employing a first unit resistive memory cell 100 and a second unit resistive memory cell 200 similar to that provided in FIG. 1. The complementary resistive memory cell has a first memory resistor ($R_1$) 114 connected between a first voltage source ($V_{S1}$) 120 and a first active transistor ($T_{A1}$) 124. A first load transistor ($T_{L1}$) 112 is connected between the first active transistor 124 and a first drain 126 connected to a drain voltage ($V_D$). A first output ($V_{O1}$) 116, also identified as a bit line (BL) is connected between the first active transistor 124 and the first load transistor 112.

The complementary resistive memory cell has a second memory resistor ($R_2$) 214 connected between a second voltage source ($V_{S2}$) 220 and a second active transistor ($T_{A2}$) 224. A second load transistor ($T_{L2}$) 212 is connected between the second active transistor 224 and a second drain 226 connected to the drain voltage ($V_D$). A second output ($V_{O2}$) 216 ($\overline{BL}$) is connected between the second active transistor 224 and the second load transistor 212. A gate voltage ($V_G$) is applied along a word line (WL) 300 connected to the gates of both the first active transistor 124 and the second active transistor 224.

The first unit resistive memory cell 100 and the second unit resistive memory cell 200 can have their respective memory resistors 114 and 214 programmed to a high-resistance state, and a low-resistance state respectively. With the first memory resistor 114 in the high-resistance state, the first output 116 will have its output voltage ($V_{O1}$) equal to about $V_D$; while the second memory resistor 214, which is in the low-resistance state, will have its output voltage ($V_{O2}$) equal to about $V_{S2}$. This corresponds to a complementary output of 1 and 0, respectively.

Figure 3:
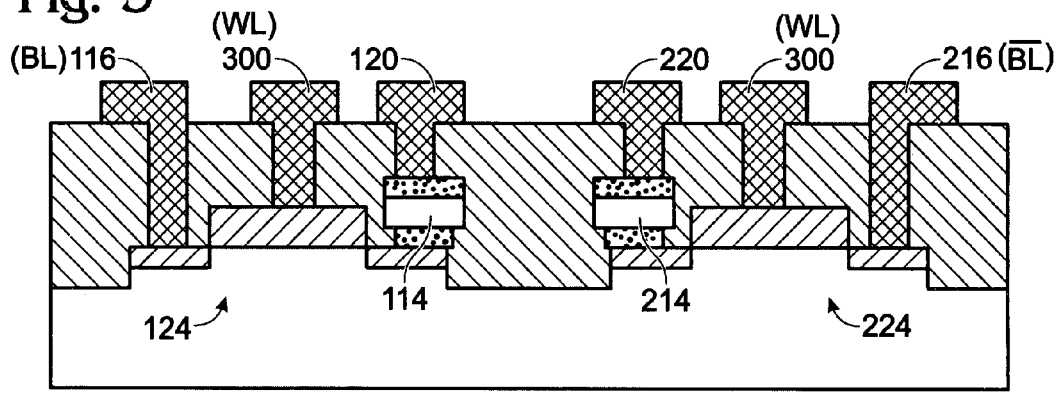
FIG. 3 is a cross-sectional view of a resistive memory structure for implementing the complementary resistive memory cell of FIG. 2.

FIG. 3 illustrates a layout cross-section of a portion of the complementary resistive memory cell shown in FIG. 2, but does not show the load transistors. The item numbers in FIG. 3 correspond to the item numbers in FIG. 2 for ease of reference to like components. The memory resistors 114 and 214 are formed using a resistive memory material. The resistive memory material is a material capable of having its resistivity changed in response to an electrical signal. The resistive memory material is preferably a perovskite material, such as a colossal magnetoresistive (CMR) material or a high temperature superconducting (HTSC) material, for example a material having the formula $Pr_{1-x}Ca_xMnO_3$ (PCMO), such as $Pr_{0.7}Ca_{0.3}MnO_3$. Another example of a suitable material is $Gd_{1-x}Ca_xBaCo_2O_{5+\delta}$, for example $Gd_{0.7}Ca_{0.3}BaCo_2O_{5+\delta}$. The resistive memory material can be deposited using any suitable deposition technique including pulsed laser deposition, rf-sputtering, e-beam evaporation, thermal evaporation, metal organic deposition, sol gel deposition, and metal organic chemical vapor deposition.

The complementary resistive memory cell shown and described in connection with FIGS. 2 and 3 is somewhat complicated to program and it may be possible to program each of the memory resistors into either the high-resistance state or the low resistance state at the same time, which would defeat the purpose of having a complementary memory cell.

Figure 4:
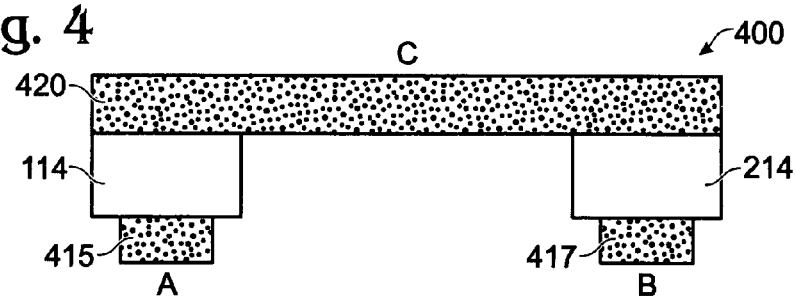
FIG. 4. is a cross-sectional view of a resistive memory structure for implementing an alternate embodiment of the complementary resistive memory cell.

A simpler complementary resistive memory cell may be achieved by taking advantage of certain resistive memory material properties. FIG. 4 shows a portion of a resistive memory cell 400, focusing on the arrangement of the memory resistors 114 and 214. A common electrode (C) 420, which corresponds to a common source connection is shown. A first electrode (A) 415 and a second electrode (B) 417 are provided.

Due in part to the effect of the field direction and pulse polarity on the resistive state of a resistive memory material, when a voltage pulse is applied to A relative to B, while C is left floating, the resistance of A and B will change in opposite relation. For example, when a positive programming pulse is applied to A with B grounded and C floating, the resistance between A and C is at a low-resistance state, while the resistance between B and C is at a high-resistance state. The same result would be achieved if a negative programming pulse were applied to B with A grounded and C floating.

Alternatively, when a negative programming pulse is applied to A with B grounded and C floating, the resistance between A and C is in a high-resistance state, while the resistance between B and C is at a low-resistance state. The same result would also be achieved if a positive programming pulse were applied to B with A grounded and C floating.

Figure 5:
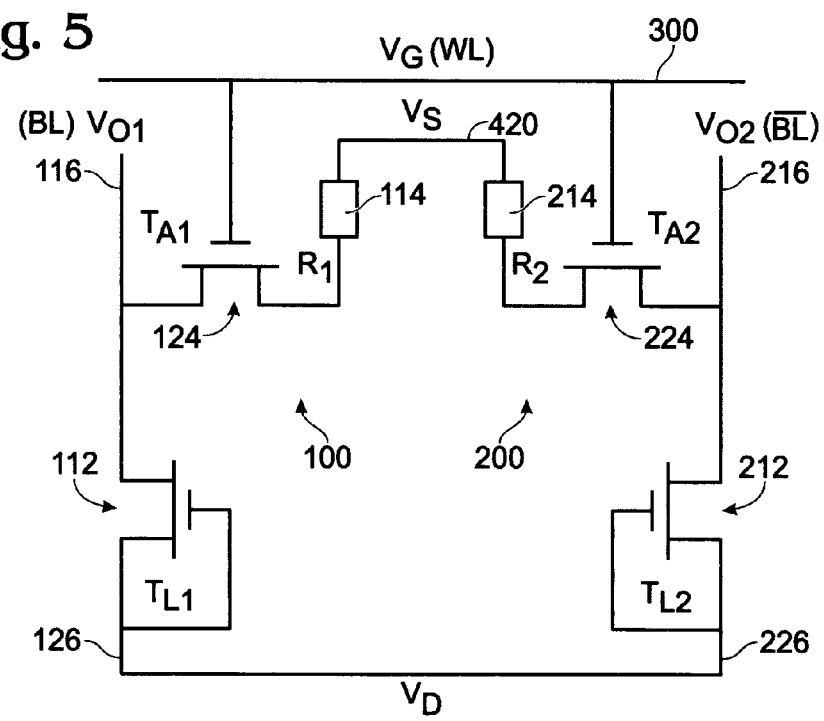
FIG. 5 is a schematic view of a complementary resistive memory cell.

FIG. 5 shows a schematic view of a complementary resistive memory unit that takes advantage of the phenomenon described above in connection with FIG. 4, and has a common voltage source/electrode ($V_S$) 420, instead of first voltage source 120 and second voltage source 220, shown in FIG. 3.

A cross-sectional view of a portion of the complementary resistive memory unit of FIG. 5 is provided in FIG. 6. Common voltage source 420 is shown.

The use of a common voltage source 420 simplifies programming of the complementary resistive memory unit as compared to the embodiment shown in FIGS. 2 and 3, without a common source. The word line 300 is biased with the programming voltage $V_P$, while the common source 420 is allowed to float. When the first output 116 ($V_{O1}$) is grounded and the second output 216 ($V_{O2}$) is allowed to float, applying a positive programming pulse at the drain voltage $V_D$, which is connected to the first drain 126 and the second drain 226, causes a positive pulse to be applied to the second memory resistor 214 with respect to the first memory resistor 114. Therefore, if the second memory resistor 214 is programmed to the low-resistance state, the first memory resistor 114 will be programmed to the opposite high-resistance state. Similarly, when the second output 216 is grounded and the first output 116 is allowed to float, applying a positive programming pulse at the drain voltage $V_D$ cause the first memory resistor 114 and the second memory resistor 214 to have the opposite complementary state, such that if the first memory resistor 114 is programmed to the low-resistance state, the second memory resistor 214 will be programmed to the high-resistance state.

As fabricated the resistance state of memory resistors 114 and 214 are unknown. The memory array has to be programmed before any application.

FIG. 7 illustrates another embodiment of a complementary resistive memory structure 500. The common electrode (C) 420, which corresponds to a common source connection is shown, along with the first electrode (A) 415 and the second electrode (B) 417. A single region 510 of resistive memory material is provided. Due to the properties of the resistive memory material and because the distance between A and C, or B and C, are shorter than the distance between A and C, this single resistive memory layer behaves similarly to that of the structure shown in FIG. 4. Any change in resistance between A and B caused by applying programming pulses is negligible compared to the changes in resistance occurring between A and C or B and C. This enables the single resistive memory material layer 510 having a first electrode 415 and a second electrode 417 on one side with a common electrode 420 on the other to act as two resistors between A and C, and between B and C, comparable to resistors 114 and 214 discussed above, and appearing the schematic view.

Accordingly, just as in the case described in connection with FIG. 4, when a voltage pulse is applied to A relative to B, while C is left floating, the resistance of A to C and B to C will change in opposite relation. For example, when a positive programming pulse is applied to A with B grounded and C floating, the resistance between A and C is at a low-resistance state, while the resistance between B and C is at a high-resistance state. The same result would be achieved if a negative programming pulse were applied to B with A grounded and C floating.

Alternatively, when a negative programming pulse is applied to A with B grounded and C floating, the resistance between A and C is in a high-resistance state, while the resistance between B and C is at a low-resistance state. The same result would also be achieved if a positive programming pulse were applied to B with A grounded and C floating.

FIG. 8 illustrates a cross-section utilizing the resistive memory structure 500, shown in FIG. 7, having a single resistive memory region 510 and a common voltage source 420.

The schematic for FIG. 5 corresponds to the structure shown in FIG. 8 as well as that of FIG. 6. When using the programming process described above, there is a large current flow through the load transistor corresponding to whichever output is grounded, the power consumption during programming may be relatively high.

Figure 9:
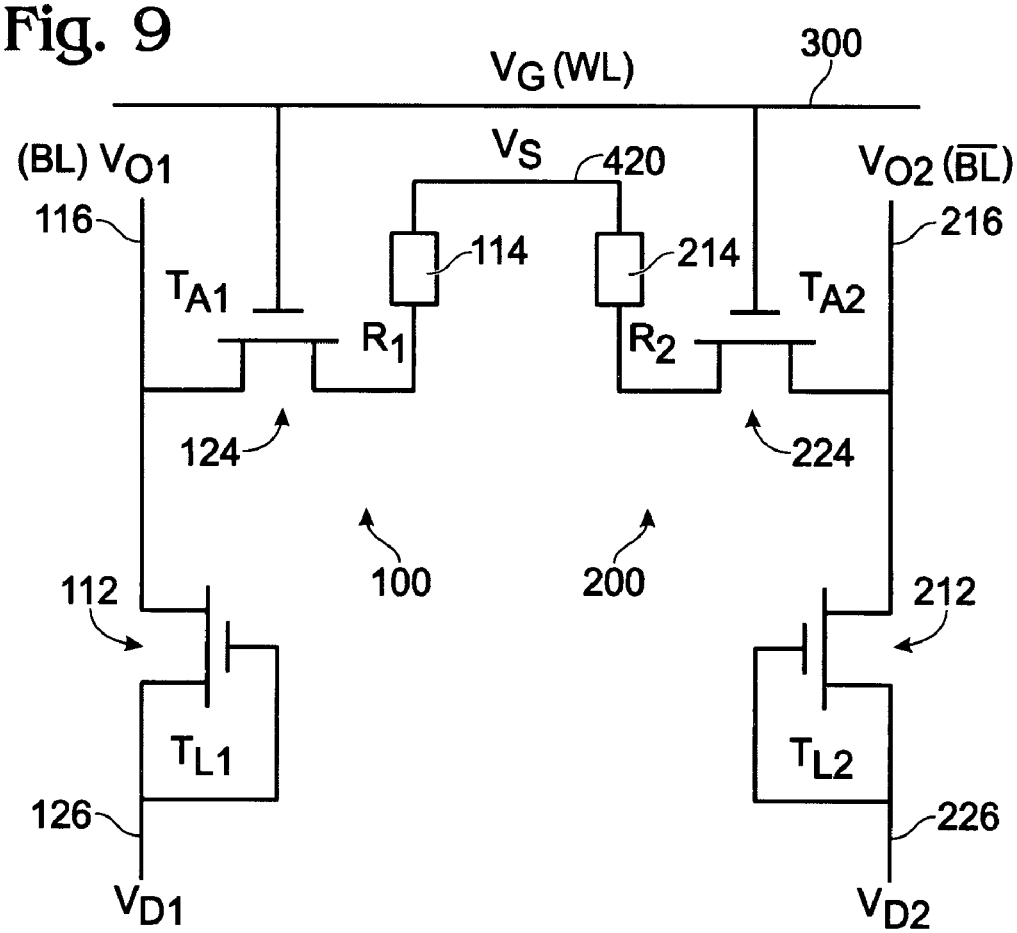
FIG. 9 is a schematic view of a complementary resistive memory cell corresponding to the memory structures with separated power supplies associated with each bit.

When the power supply of the load transistors is separated, as shown in FIG. 9, the programming power may be significantly reduced. The first load transistor ($T_{L1}$) 112 has drain 126 connected to a first drain voltage ($V_{D1}$), while the second load transistor ($T_{L2}$) 212 has drain 226 connected to a second drain voltage ($V_{D2}$). To program this embodiment, the word line 300 is biased with the programming voltage $V_P$, while the common voltage source 420 is allowed to float. When the first output 116 ($V_{O1}$) is grounded and the second output 216 ($V_{O2}$) and the drain 126 are allowed to float, applying a positive programming pulse to drain voltage $V_{D2}$ at drain 226 causes a positive pulse to be applied to the second memory resistor 214 with respect to the first memory resistor 114. Therefore, if the second memory resistor 214 is programmed to the low-resistance state, the first memory resistor 114 will be programmed to the opposite high-resistance state. Since power is not applied to the first drain, the first load transistor ($T_{L1}$) draws a relatively insignificant amount of power, significantly reducing power consumption during programming.

In an alternative power-saving, programming process, the power consumption of the load resistors is significantly reduced by allowing the drain voltage ($V_D$) to float during the programming operation. This may be accomplished by grounding the first output 116 and biasing the word line 300 with the programming voltage $V_P$, while the common source 420 and the drain voltage $V_D$ at the first drain 126 are allowed to float, and a programming pulse is applied to the second output 216, which will cause a positive pulse to be applied to the second memory resistor 214 with respect to the first memory resistor 114. Therefore if the second memory resistor 214 is programmed to the low-resistance state, the first memory resistor will be programmed to the opposite state, in this case the high-resistance state. Note that the drain voltage $V_D$ may be allowed to float whether there is a single drain voltage $V_D$, or separated drain voltages $V_{D1}$ and $V_{D2}$ with both floating. Similar to the processes described above, this programming sequence can be modified by applying a negative pulse to the second output 216, or by grounding the second output 216 and applying the either a positive or negative programming pulse to the first output 116.

For one embodiment of the present complementary resistive memory unit, the process of reading the complementary resistive memory unit is achieved by applying ground to the voltage source of both sources $V_{S1}$ and $V_{S2}$, and applying a read voltage at the gate voltage $V_G$ through the word line 300 and to the drains 126 and 226 through a single drain source $V_D$. The output voltage $V_{O1}$ at the first output 116 and the output voltage $V_{O2}$ at the second output 216 will be complementary such that when $V_{O1}$ is 1, $V_{O2}$ is 0; and when $V_{O1}$ is 0, $V_{O2}$ is 1.

For another embodiment of he present complementary resistive memory unit, the process of reading the complementary resistive memory unit is achieved by applying ground to the common source voltage $V_S$ at common voltage source 420, and applying a read voltage at the gate voltage $V_G$ through the word line 300 and to the drains 126 and 226 through a single drain source $V_D$. The output voltage $V_{O1}$ at the first output 116 and the output voltage $V_{O2}$ at the second output 216 will be complementary such that when $V_{O1}$ is 1, $V_{O2}$ is 0; and when $V_{O1}$ is 0, $V_{O2}$ is 1.

For another embodiment of the present complementary resistive memory unit having separated power supplies, the process of reading the complementary resistive memory unit is achieved by applying ground to the common voltage source $V_S$ at common source 420, and applying a read voltage at the gate voltage $V_G$ through the word line 300 and to each drain 126 and 226 through the drain electrodes $V_{D1}$, and $V_{D2}$. The output voltage $V_{O1}$ at the first output 116 and the output voltage $V_{O2}$ at the second output 216 will be complementary such that when $V_{O1}$ is 1, $V_{O2}$ is 0; and when $V_{O1}$ is 0, $V_{O2}$ is 1.

Although embodiments, including certain preferred embodiments, have been discussed above, the coverage is not limited to any specific embodiment. Rather, the claims shall determine the scope of the invention.

What is claimed is:

1. A memory structure comprising:
    a first memory resistor connected between a first voltage source and a first active transistor at a first active transistor source; a first load transistor connected between a drain voltage and the first active transistor at a first active transistor drain; and a first output connected at the first active transistor drain;
    a second memory resistor connected between a second voltage source and a second active transistor at a second active transistor source; a second load transistor connected between the drain voltage and the second active transistor at a second active transistor drain; and a second output connected at the second active transistor drain; and
    a word line connected to a gate of the first active transistor and to a gate of the second active transistor
    wherein, with one of the first memory resistor and second memory resistor set to a high resistance and the other of the first memory resistor and second memory resistor set to a low resistance, the output connected to one of the memory resistors is high and the output connected to the other of the memory resistors is low.

2. The memory structure of claim 1, wherein the first memory resistor comprises a colossal magnetoresistance (CMR) material.

3. The memory structure of claim 1, wherein the first memory resistor comprises $Pr_{1-x}Ca_xMnO_3$ (PCMO).

4. The memory structure of claim 1, wherein the first memory resistor comprises $Gd_{1-x}Ca_xBaCo_2O_{5+\delta}$.

5. A method of programming a complementary resistive memory structure having a common electrode separated from a first electrode in a first active transistor and a second electrode in a second active transistor by a resistive memory material comprising:
    grounding the first electrode in the first active transistor;
    allowing the common electrode to float; and
    applying a programming pulse to the second electrode in the second active transistor.

6. The method of claim 5, wherein the programming pulse is a positive pulse.

7. The method of claim 5, wherein the programming pulse is a negative pulse.

8. The method of claim 5, wherein the programming pulse is applied through the second active transistor connected to the second electrode, wherein the second active transistor has a gate and wherein the programming pulse is applied to the gate of the second active transistor.

* * * * *